(12) United States Patent
de Bock et al.

(10) Patent No.: US 11,573,053 B2
(45) Date of Patent: Feb. 7, 2023

(54) CYCLONE COOLER DEVICE

(71) Applicant: General Electric Company, Schenectady, NY (US)

(72) Inventors: Hendrik Pieter Jacobus de Bock, Clifton Park, NY (US); Corey Bourassa, Niskayuna, NY (US); William Dwight Gerstler, Niskayuna, NY (US)

(73) Assignee: General Electric Company, Schenectady, NY (US)

( * ) Notice: Subject to any disclaimer, the term of this patent is extended or adjusted under 35 U.S.C. 154(b) by 146 days.

(21) Appl. No.: 16/539,807

(22) Filed: Aug. 13, 2019

(65) Prior Publication Data
US 2021/0048255 A1 Feb. 18, 2021

(51) Int. Cl.
| | |
|---|---|
| *F28D 15/02* | (2006.01) |
| *F28F 13/12* | (2006.01) |
| *H01L 23/467* | (2006.01) |
| *F28F 1/40* | (2006.01) |
| *H05K 7/20* | (2006.01) |
| *F28D 21/00* | (2006.01) |

(52) U.S. Cl.
CPC ............ *F28D 15/0233* (2013.01); *F28F 1/40* (2013.01); *F28F 13/12* (2013.01); *H01L 23/467* (2013.01); *H05K 7/20254* (2013.01); *F28D 2021/0028* (2013.01)

(58) Field of Classification Search
CPC .......... F28D 15/0233; F28D 2021/0028; F28F 13/12; H01L 23/427; H05K 7/20254; H05K 7/2029; H05K 7/20309; H05K 7/2059; H05K 7/20663; H05K 7/208; H05K 7/20881; H05K 7/20936; H05K 7/209

See application file for complete search history.

(56) References Cited

U.S. PATENT DOCUMENTS

| | | | | |
|---|---|---|---|---|
| 4,899,810 | A | * | 2/1990 | Fredley ................. F28D 15/043 165/104.14 |
| 5,088,005 | A | | 2/1992 | Ciaccio |
| 5,167,275 | A | * | 12/1992 | Stokes .................... F28F 13/12 165/109.1 |

(Continued)

OTHER PUBLICATIONS

Kang, "Advanced Cooling for Power Electronics" ResearchGate, International Conference on Integrated Power Electronics Systems, CIPS 2012, Mar. 6-8, Nuremberg, Germany (9 pages).

(Continued)

*Primary Examiner* — Eric S Ruppert
*Assistant Examiner* — Hans R Weiland
(74) *Attorney, Agent, or Firm* — Dority & Manning, P.A.

(57) ABSTRACT

A cyclone cooler device includes a housing that defines an interior channel elongated along a center axis. One or more of the fluid passage or configuration of an inlet end of the channel is shaped to induce a swirling flow of a cooling fluid within the channel while the channel is thermally coupled with one or more heat sources. The swirling flow of the cooling fluid removes thermal energy from and cools the one or more heat sources. During the swirling flow, the cooling fluid rotates around the center axis of the channel while also moving along the length of the center axis. The cooling fluid changes phases during the swirling flow to cool the heat source(s).

22 Claims, 8 Drawing Sheets

(56) References Cited

U.S. PATENT DOCUMENTS

| | | | |
|---|---|---|---|
| 6,031,751 A * | 2/2000 | Janko | H05K 7/20936 363/144 |
| 6,411,512 B1 | 6/2002 | Mankaruse et al. | |
| 7,010,930 B2 | 3/2006 | Arik et al. | |
| 9,899,789 B2 | 2/2018 | Downing | |
| 9,915,176 B2 | 3/2018 | Murray et al. | |
| 10,036,319 B2 | 7/2018 | Murray et al. | |
| 2001/0020365 A1* | 9/2001 | Kubo | F28F 3/12 62/1 |
| 2006/0081362 A1* | 4/2006 | Sanatgar | F28F 13/12 165/154 |
| 2009/0320500 A1* | 12/2009 | Kim | F28F 13/12 62/5 |
| 2010/0155040 A1* | 6/2010 | Hoffmann | H01L 23/473 165/180 |
| 2012/0180979 A1* | 7/2012 | Harrington | H01L 23/473 165/11.1 |
| 2013/0146255 A1* | 6/2013 | Kim | H05K 7/20936 165/104.13 |
| 2013/0146256 A1* | 6/2013 | Nicolas | H01L 23/473 165/104.19 |
| 2014/0262165 A1* | 9/2014 | Ishimori | F28F 13/12 165/109.1 |
| 2014/0301031 A1* | 10/2014 | Louvar | H05K 7/20254 361/679.31 |
| 2016/0165757 A1* | 6/2016 | Norton | H01L 23/427 165/80.4 |
| 2016/0290738 A1* | 10/2016 | Kupiszewski | F28F 13/12 |
| 2017/0114720 A1 | 4/2017 | Stone et al. | |
| 2017/0122202 A1 | 5/2017 | Rahaim et al. | |
| 2017/0202108 A1* | 7/2017 | Torresin | H05K 7/20309 |
| 2018/0016944 A1 | 1/2018 | Buhler et al. | |
| 2018/0202722 A1* | 7/2018 | Jackson | F28D 7/022 |
| 2020/0107472 A1* | 4/2020 | Rush | F28F 13/12 |
| 2020/0236806 A1* | 7/2020 | Al Omari | H01L 23/427 |
| 2020/0326141 A1* | 10/2020 | Wang | F28F 13/12 |
| 2020/0395159 A1* | 12/2020 | Liu | F28F 13/12 |
| 2020/0400377 A1* | 12/2020 | Retersdorf | F28F 3/02 |

OTHER PUBLICATIONS

Maxa, "Thermal Peak Management Using Organic Phase Change Materials for Latent Heat Storage in Electronic Applications", Materials, 2018, vol. 11 Issue: 01, Published Dec. 26, 2017 (15 pages).

Raut, "Design and Analysis of Liquid Cooled Cold Plates using CAD Modeling" vol. 3 Issue:1 pp. 1273-1277 Nov.-Dec. 2018 (5 pages).

* cited by examiner

CYCLONE COOLER DEVICE

FIELD

The subject matter described herein relates to cooling devices.

BACKGROUND

The growth in use of pulsed power electronic systems has demonstrated a corresponding increasing need for improved cooling applications to remove heat from these electronic systems. While the cooling of some known steady-state power conversion applications has improved from various packaging and other cooling improvements, these improvements have not been shown to have the same ability to cool transient applications such as pulsed power electronic systems. For example, some known cooling applications that integrate cooling devices into the packaging of the electronic systems have been found to have decreased thermal capacity associated with increasing package integration. This creates a potential for increased peak junction temperatures and temperature swings during transient operation of the electronic systems when pulse widths approach a thermal time constant of the packaging of the electronic systems. For example, as the packaging (e.g., the housing that contains the electronic system and cooling application) becomes integrated and smaller, the peak temperature of the electronic system increases and the maximum-to-minimum junction temperature of the electronic system increases during transient operation of the electronic system.

BRIEF DESCRIPTION

In one embodiment, a cyclone cooler device includes a housing that defines one or more interior channels forming one or more fluid passages. Each of the one or more fluid passages is elongated along a center axis from an inlet end of the fluid passage to an opposite, outlet end of the fluid passage. The inlet end of each of the one or more fluid passages is configured to be fluidly coupled with one or more replenishing sources of one or more cooling fluids. Each of the one or more fluid passages also is configured to be thermally coupled with one or more heat sources. One or more of the fluid passages or configurations of the inlet ends of the fluid passages are shaped to induce a swirling flow of the one or more cooling fluids within the one or more fluid passages while the one or more fluid passages are thermally coupled with the one or more heat sources. The swirling flow of the one or more cooling fluids removes thermal energy from and cools the one or more heat sources.

In one embodiment, a cold plate assembly includes a cold plate outer housing configured to be in thermal contact with a heat source and a housing having two or more fluid passages that are each elongated along a center axis and that each define an interior channel along the center axis from a first end of the fluid passage to an opposite, second end of the fluid passage. The fluid passage is shaped to induce a swirling flow of a cooling fluid within the fluid passage while the fluid passage is thermally coupled with the heat source. The swirling flow of the fluid passage removes thermal energy from and cools the heat source.

In one embodiment, a method for cooling a heat source is provided. The method includes directing a flow of a cooling fluid into a fluid passage within a housing. The fluid passage is elongated along a center axis. The method also includes removing thermal energy from the heat source by inducing a swirling movement of the cooling fluid in the fluid passage around the center axis and along the center axis. The swirling movement of the cooling fluid involves a vaporized portion of the cooling fluid rotating around and radially inward toward the center axis and away from the heat source for condensing into a condensed portion of the cooling fluid. The swirling movement of the cooling fluid also involves the condensed portion of the cooling fluid rotating around and radially outward away from the center axis and toward the heat source.

BRIEF DESCRIPTION OF THE DRAWINGS

The present invention will be better understood from reading the following description of non-limiting embodiments, with reference to the attached drawings, wherein below.

DETAILED DESCRIPTION

Embodiments of the subject matter described herein provide cooling devices, packages, and methods that provide higher thermal capacitances while maintaining lower thermal resistances to cooling fluids than at least some known cooling devices, packages, and methods. While the Background describes cooling issues with respect to transient applications (e.g., pulsed electronics), one or more (or each) of the embodiments described herein may be used to cool steady-state and/or transient applications.

At least one embodiment of the cooler device described herein is referred to as a package integrated cyclone cooler (PICCO) device. The cooler device provides increased thermal capacity using a two-phase re-condensing cyclone cooler, which has superior heat transfer and critical heat flux performance than other cooling devices.

Figure 1:
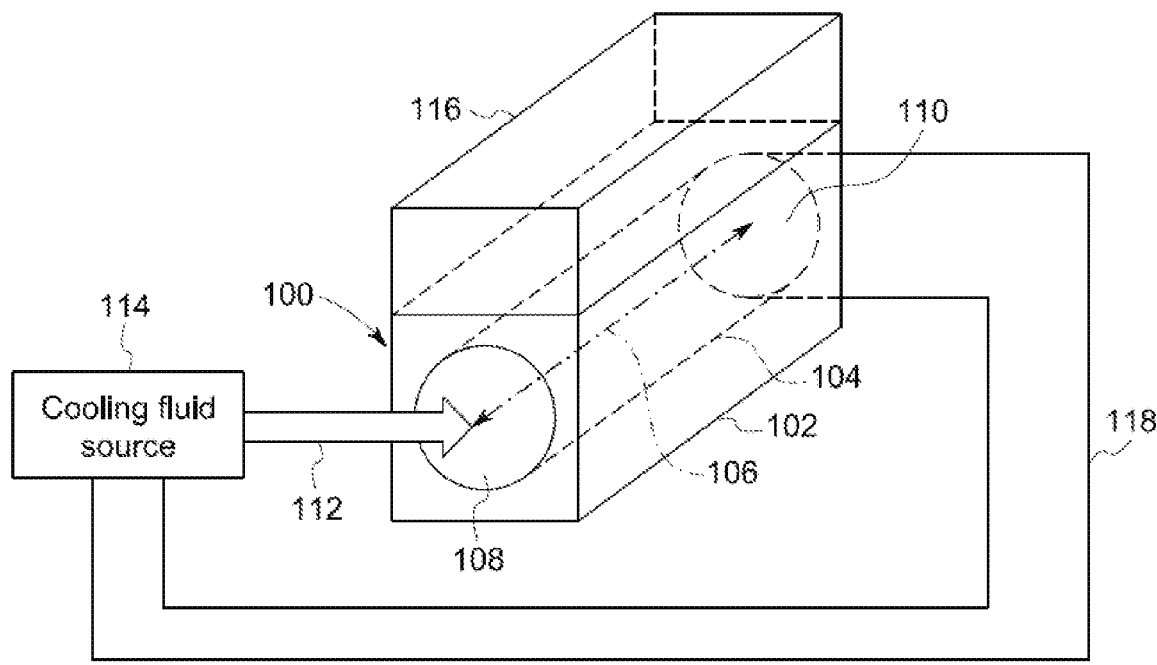
FIG. 1 schematically illustrates a perspective view of one embodiment of a cooler device.
Figure 2:
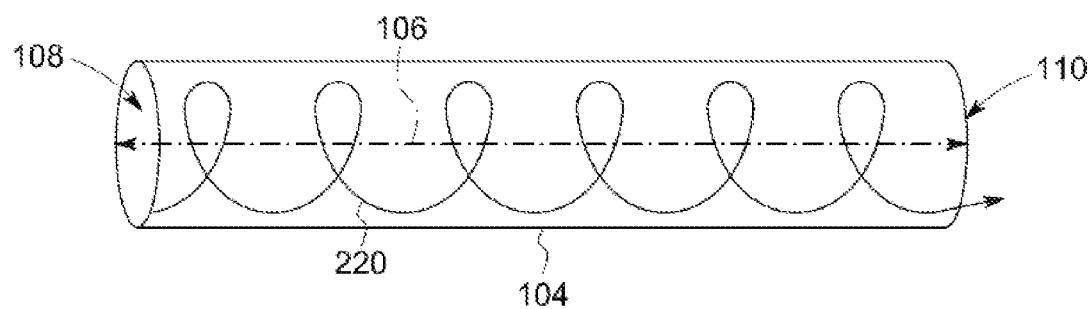
FIG. 2 schematically illustrates a side view of a swirling flow of a cooling fluid in a fluid passage defined by a channel in a housing of the cooler device shown in FIG. 1.

FIG. 1 schematically illustrates a perspective view of one embodiment of a cooler device 100. The cooler device 100 optionally can be referred to as a cyclone cooler device. The cooler device 100 includes a housing 102 that defines one or more interior channels 104. While only one channel 104 is shown in FIGS. 1 and 2, optionally, the housing 102 may include more than a single channel 104. The multiple channels 104 may be separate from each other within the housing 102. For example, the channels 104 may not be fluidly coupled such that a cooling fluid 112 in one channel 104 cannot flow into another channel 104 inside the housing 102. The cooler devices and housings described herein can be formed using additive manufacturing.

Each channel 104 forms a fluid passage in which cooling fluid 112 flows, as described herein. The channel 104 and the fluid passage defined by the channel 104 is elongated along a center axis 106 from an inlet end 108 to an opposite, outlet end 110. The inlet end 108 is fluidly coupled with one or more replenishing sources 114 ("Cooling fluid sources" in FIG. 1) of the cooling fluid 112.

In the illustrated embodiment, the inlet end 108 and the outlet end 110 are openings that are disposed on opposite ends of the channel 104. These ends 108, 110 can optionally be referred to as an inlet opening and an outlet opening, respectively. As described in connection with other embodiments, however, one or both of the ends 108, 110 may be closed with another inlet opening and/or outlet opening provided. The cooling fluid is introduced into the fluid passage defined by the channel 104 through or via the inlet end 108 and exits from the fluid passage through or via the outlet end 110.

The housing 102 may include or be coupled with one or more heat sources 116. The heat source 116 can represent an electronic package, such as one or more circuits, processors, or the like, that generates heat as a byproduct of operation. For example, the heat source 116 may generate heat due to the heat source 116 performing other work that generates heat, instead of the heat source 116 operating only to produce heat. The channel 104 may be positioned in the housing 102 such that the fluid passage is thermally coupled with the heat source 116. For example, the channel 104 is sufficiently close to the heat source 116 that thermal energy generated by the heat source 116 is transferred to the cooling fluid in the fluid passage defined by the channel 104.

With continued reference to the cooler device 100 shown in FIG. 1, FIG. 2 schematically illustrates a side view of a swirling flow 220 of the cooling fluid 112 in the fluid passage defined by the channel 104 in the housing 102 of the cooler device 100 shown in FIG. 1. As described herein, the fluid passage or channel 104 is shaped or otherwise configured to induce the swirling flow 220 of the cooling fluid 112 within the passage defined by the channel 104 while the passage is thermally coupled with the heat source 116. The swirling flow 220 can involve the cooling fluid 112 moving along a path that moves the fluid 112 along the length of the passage defined by the channel 104 from the inlet end 108 toward the outlet end 110. During movement of the fluid 112 along this path, the fluid 112 also flows around the center axis 106. For example, the fluid 112 also may flow around the center axis 106. In doing so, the fluid 112 may move along a helical or spiral path from the inlet end 108 to the outlet end 110 and around the center axis 106. Alternatively, the cooling fluid 112 may flow in a non-swirling manner, such as in a linear or laminar flow, a non-laminar flow that does not rotate around the center axis, or the like.

The swirling flow 220 of the cooling fluid 112 can be created by cooler device 100 without the cooler device 100 moving relative to the heat source 116. Instead of the cooler device 100 rotating or otherwise moving to swirl the cooling fluid 112 around the center axis 106, the channel 104 can be shaped to induce the swirling flow 220 such that the cooling fluid 112 swirls around the center axis 106 without the cooler device 100 moving relative to the heat source 116. For example, the interior surface of the housing that defines the channel 104 can include ridges that induce this swirling flow 220 (as described below in connection with FIG. 3), the inlet opening through which the cooling fluid 112 flows into the channel 104 can be positioned to induce the swirling flow 220 (as described below in connection with FIG. 5), and/or the outlet opening through which the cooling fluid 112 flows out of the channel 104 can be positioned to induce the swirling flow 220 (as described below in connection with FIG. 6).

This swirling flow 220 of the cooling fluid 112 removes thermal energy from and cools the heat source 116, as described below. The cooling fluid 112 may absorb the thermal energy and flow out of the passage defined by the channel 104. The cooling fluid 112 may then flow through one or more conduits 118 to dissipate the thermal energy to another location (e.g., the ambient environment away from the heat source 106, a condenser, etc.). This can help remove the thermal energy from and cool the cooling fluid 112. These conduits 118 can then direct the cooling fluid 112 back to the replenishing source 114 of the cooling fluid 112 to later be directed into the passage defined by the channel 104 one or more additional times in a cyclic manner.

Figure 3:
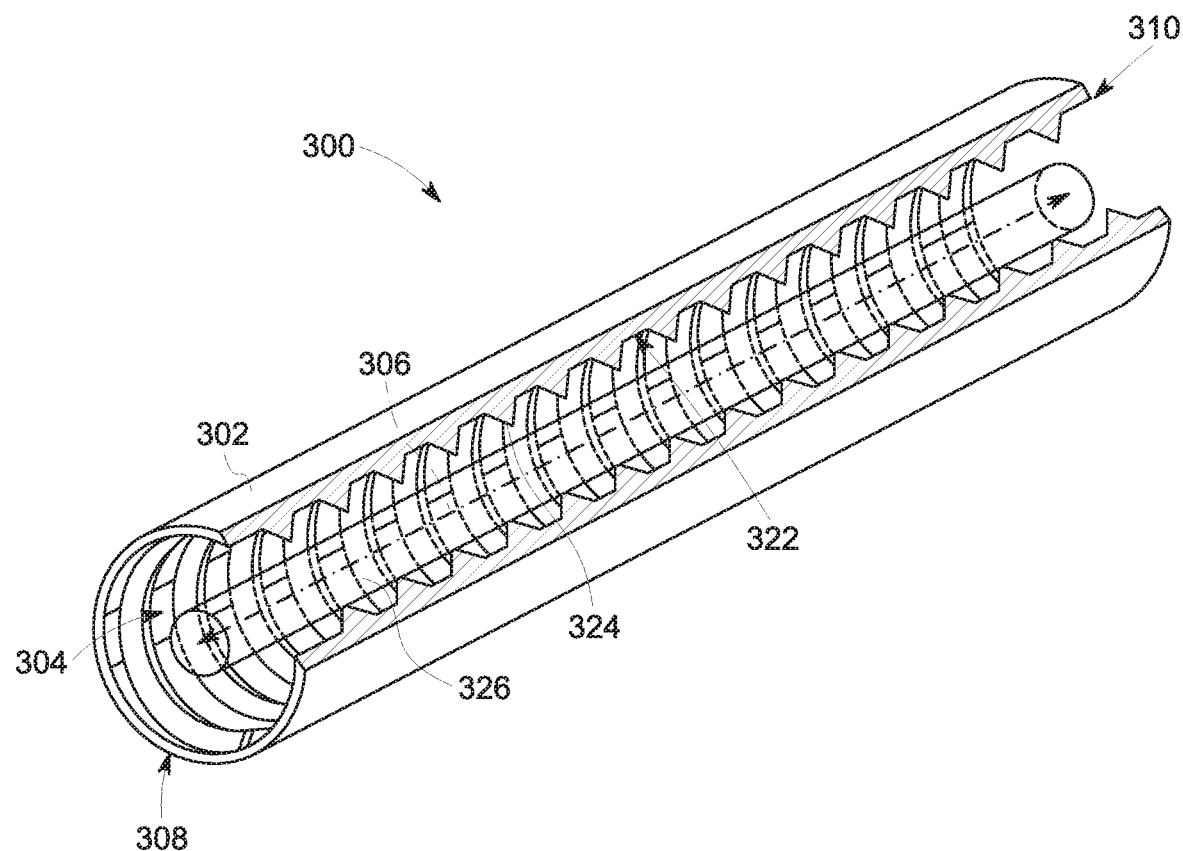
FIG. 3 is a partial cut-away perspective view of one embodiment of a cooler device.

FIG. 3 is a partial cut-away perspective view of one embodiment of a cooler device 300. The cooler device 300 can represent the cooler device 100 shown in FIGS. 1 and 2. The cooler device 300 includes a channel 304 that defines a fluid passage that extends from an inlet end 308 to the outlet end 310 along a center axis 306, similar to the channel 104, the ends 108, 110, and the center axis 306 (shown in FIGS. 1 and 2) described above. The cooler device 300 includes a housing 302 similar to the housing 102, with only the portion of the housing 302 that defines the channel 304 shown in FIG. 3.

An interior surface 322 of the housing 302 encloses and defines the channel 304 between the inlet and outlet ends 308, 310. This interior surface 322 can be shaped to induce the swirling flow 220 of the cooling fluid 112 in the passage defined by the channel 304. For example, the interior surface 322 can include ridges 324 that protrude radially inward from the interior surface 322 toward the center axis 306. As shown in FIG. 3, ridges 324 can include a triangular cross-section profile or shape, such that each ridge 324 defines an angled point (or pointed angle) at a radially inward most point of the ridge 324. In the example shown, the angled point is formed by two surfaces of the ridge 324 that come together at an acute angle. These ridges 324 may protrude partially from the interior surface 322 toward the center axis 306 without extending the entire way to the center axis 306. Alternatively, one or more of the ridges 324 can extend entirely to the center axis 306. In the illustrated embodiment, the ridges 324 are helical ridges that are elongated along one or more helical or spiral paths along the interior surface 322. The ridges 324 are positioned in the channel 304 to create the swirling flow 220 of the cooling fluid 112. The cooling fluid 112 may be directed into the swirling flow 220 as the cooling fluid 112 contacts the ridges 324.

Optionally, one or more of the cooler devices described herein can include a containment that includes a phase change material or cooling fluid. For example, the cooler device 300 can include a containment 326 that extends along and/or around the center axis 306, as shown in FIG. 3. This containment 326 can be a sealed or enclosed cylindrical chamber in which a phase change material is disposed. Alternatively, the containment 326 can be a conduit disposed in the channel 304 in which the same cooling fluid 112 or another cooling fluid flows from one end of the containment 326 (e.g., at the inlet end 308) to the opposite end of the containment 326 (e.g., at the outlet end 310). This additional or alternate cooling fluid can be directed into and through the containment 326 from the same or different source 114 and can be directed out of the containment 326 and back to the same or different source 114 via the same or other conduits 118. The containment 326 optionally can be referred to as a condenser as the containment 326 draws thermal energy from the fluid, vapor, or supercritical state of the cooling fluid 112 to condense the vapor or supercritical phase of the cooling fluid 112 to the liquid phase of the cooling fluid 112.

Figure 4:
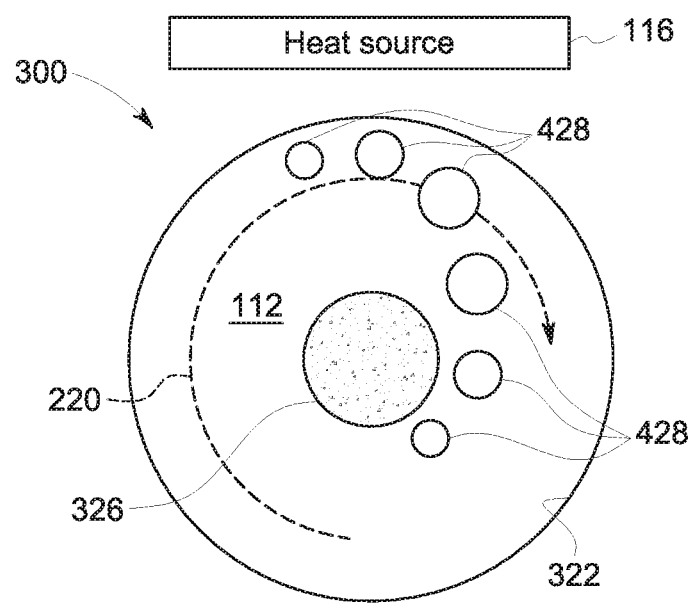
FIG. 4 illustrates a cross-sectional view of the cooler device shown in FIG. 3 during swirling flow of the cooling fluid in the channel of the cooler device according to one embodiment.

FIG. 4 illustrates a cross-sectional view of the cooler device 300 shown in FIG. 3 during swirling flow 220 of the cooling fluid 112 in the channel 304 of the cooler device 300 according to one embodiment. The cross-sectional plane of the cooler device 300 shown in FIG. 4 is perpendicular to the center axis 306 of the cooler device 300 shown in FIG. 3. The heat source 116 is shown above the cooler device 300 such that the cooling fluid 112 in the channel 304 is thermally coupled with the heat source 116. Although not shown in FIG. 4, at least part of the housing in which the cooler device 300 is disposed may be located between the heat source 116 and the cooler device 300, as shown in FIG. 1 with the cooler device 100.

The cooling fluid 112 is a phase-changing material that changes phases in response to being exposed to heat from the heat source to remove thermal energy from the heat source 116. Examples of the cooling fluid 112 include water, FLUORINET electronic liquid FC-72, or a refrigerant (e.g., R134a, R1234yf, R1234ze(Z), etc.). Optionally, the cooling fluid 112 can be a fluid that can change phase top the supercritical state for heat transfer, such as carbon dioxide, refrigerant R1234ze (Z), or the like. Supercritical fluids exhibit the density of a liquid but have viscosity and other behaviors like a gas, therefore allowing for high Reynolds number and subsequently high heat transfer coefficients.

The cooling fluid 112 may flow inside the channel 304 at pressures that reinforce and internally support the interior surfaces 322 of the channel 304 to prevent internal collapse of the channel 304. Alternatively, interior reinforcing structures, such as posts, beams, or the like, that extend from one area of the internal surface 322 to an opposite area of the internal surface 322, can be provided (e.g., via additive manufacturing of the cooler device 300) to provide internal support of the channel 304.

In operation, the swirling flow 220 of the cooling fluid 112 develops a density gradient such that (a) cooler portions of the cooling fluid 112 moves toward the outer radius of the channel 304 and (b) hotter or phase-changed portions of the cooling fluid 112 move toward the inner radius of the channel 304. For example, portions of the cooling fluid 112 that are farther from the center axis 306 in the channel 304 and closer to the heat source 116 than other portions of the cooling fluid 112 may change phases to a supercritical or vapor state. In the illustrated example, the supercritical or vapor state is represented by the formation of bubbles 428 in the cooling fluid 112. The supercritical or vapor state of the cooling fluid 112 has a lower density than the cooler portions of the cooling fluid 112 that are not in the supercritical or vapor state (e.g., that are in the liquid state). Because the vapor or supercritical phase of the cooling fluid 112 has a lower density than the liquid phase of the cooling fluid 112, acceleration of the cooling fluid 112 in the swirling flow 220 promotes buoyancy forces that separate the two states of the cooling fluid 112. As the supercritical or vapor phase portion of the cooling fluid 112 rotates around the center axis 306 and toward the outlet end 310 of the channel 304, the supercritical or vapor phase portion of the cooling fluid 112 moves farther from the heat source 116 and radially inward (toward the center axis 306) and cools. The cooling fluid 112 can continue rotating around the center axis 306 to again be heated by the heat source 116 as the cooling fluid 112 moves in the channel 304. In the illustrated embodiment, the containment 326 can include or be an internal condensing core that is either filled with a heat absorbing phase-changing material or that carries a subcooled liquid through the containment 326. The supercritical or vapor phase portion of the cooling fluid 112 can be cooled by the containment 326.

Stated differently, the swirling flow 220 of the cooling fluid 112 can involve a cooler liquid state of the swirling flow 220 of the cooling fluid 112 to rotate radially outward toward the heat source 116 and a vapor or supercritical state of the cooling fluid 112 rotating radially inward toward the center axis 306 due to a difference in density between the different states of the swirling flow 220 of the cooling fluid 112. The vaporized portion of the cooling fluid 112 rotates around and rotates radially inward toward the center axis 306 and away from the heat source 116. This vaporized portion is condensed into a condensed portion of the cooling fluid 112. The condensed portion of the cooling fluid 112 is moved by the swirling flow 220 around and radially outward away from the center axis 306 back toward the heat source 116 for additional heating.

In the example shown in FIG. 3, the swirling flow 220 is induced, created, or promoted by the ridges 324. Alternatively, the swirling flow 220 can be induced, created, or promoted by a tangential inlet opening and/or outlet opening into the channel 304.

Figure 5:
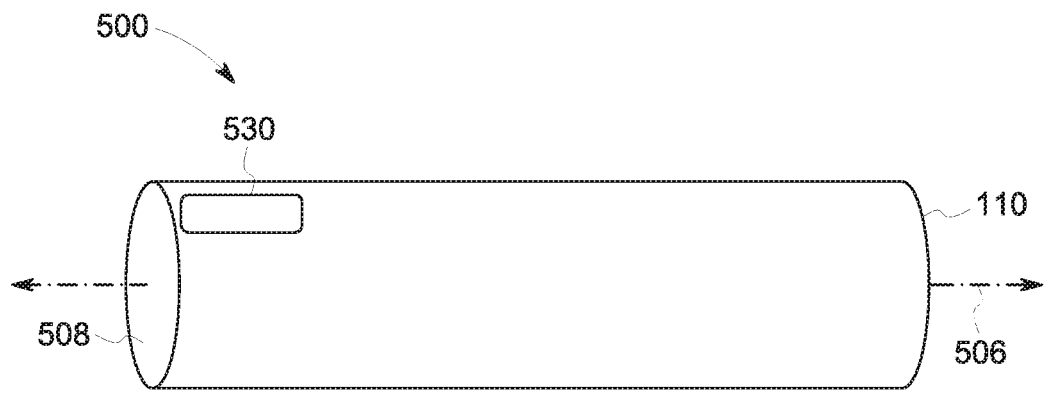
FIG. 5 illustrates a side view of an embodiment of a cooler device that includes a tangential inlet opening.

FIG. 5 illustrates a side view of an embodiment of a cooler device 500 that includes a tangential inlet opening 530. The cooler device 500 can represent one or more of the cooler devices 100, 300, with one difference being that an inlet end 508 of the cooler device 500 is closed instead of open like the inlet end 108 of the cooler device 100 shown in FIG. 1. The cooler device 500 can include the outlet end 110 described above in connection with the cooler device 100. The inlet opening 530 provides a path through which the cooling fluid 112 is directed into the fluid passageway defined by the channel inside the cooler device 500. The inlet opening 530 is oriented such that the cooling fluid 112 is directed into the fluid passage along a tangential direction. For example, instead of directing the cooling fluid 112 into the passage in a direction along a center axis 506 of the passage, the cooling fluid 112 is directed in a direction that is angled with respect to the center axis 506. This causes the fluid 112 to begin swirling within the passage, as described above.

Figure 6:
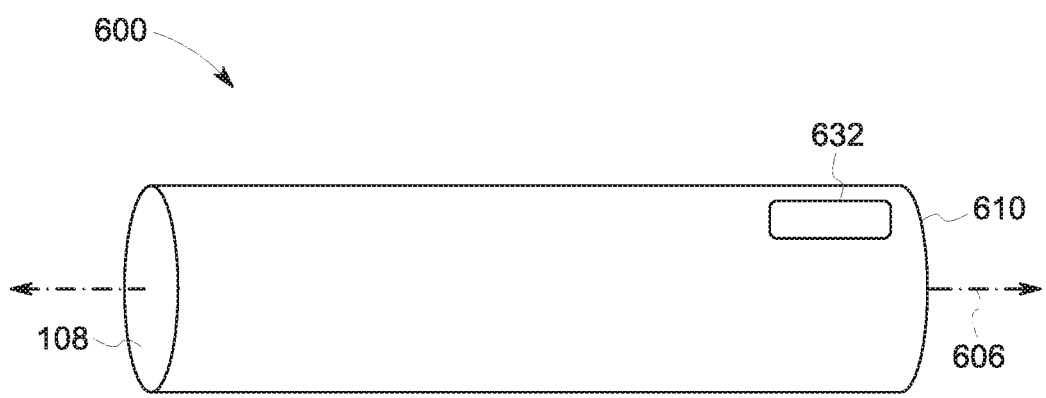
FIG. 6 illustrates a side view of an embodiment of a cooler device that includes a tangential outlet opening.

FIG. 6 illustrates a side view of an embodiment of a cooler device 600 that includes a tangential outlet opening 632. The cooler device 600 can represent one or more of the cooler devices 100, 300, 500, with one difference being that an outlet end 610 of the cooler device 600 is closed instead of open like the outlet end 110 of the cooler device 100 shown in FIG. 1. The cooler device 600 can include the inlet end 108 described above in connection with the cooler device 100. The outlet opening 532 provides a path through which the cooling fluid 112 is directed out of the fluid passageway defined by the channel inside the cooler device 600. The outlet opening 632 is oriented such that the cooling fluid 112 is directed out of the fluid passage along a tangential direction relative to a center axis 606 of the passage. For example, instead of directing the cooling fluid 112 out of the passage in a direction along the center axis 606 of the passage, the cooling fluid 112 is directed out of the passage in a direction that is angled with respect to the center axis 606. This can induce the swirling flow 220 of the fluid 112 that is in the passage. For example, directing the cooling fluid 112 out of the passage along a tangential direction can cause portions of the cooling fluid 112 that are upstream of the outlet opening 632 to move in the swirling flow 220.

A variety of housings can be provided to include one or more of the cooler devices described herein. These housings optionally can be referred to as packaging.

Figure 7:
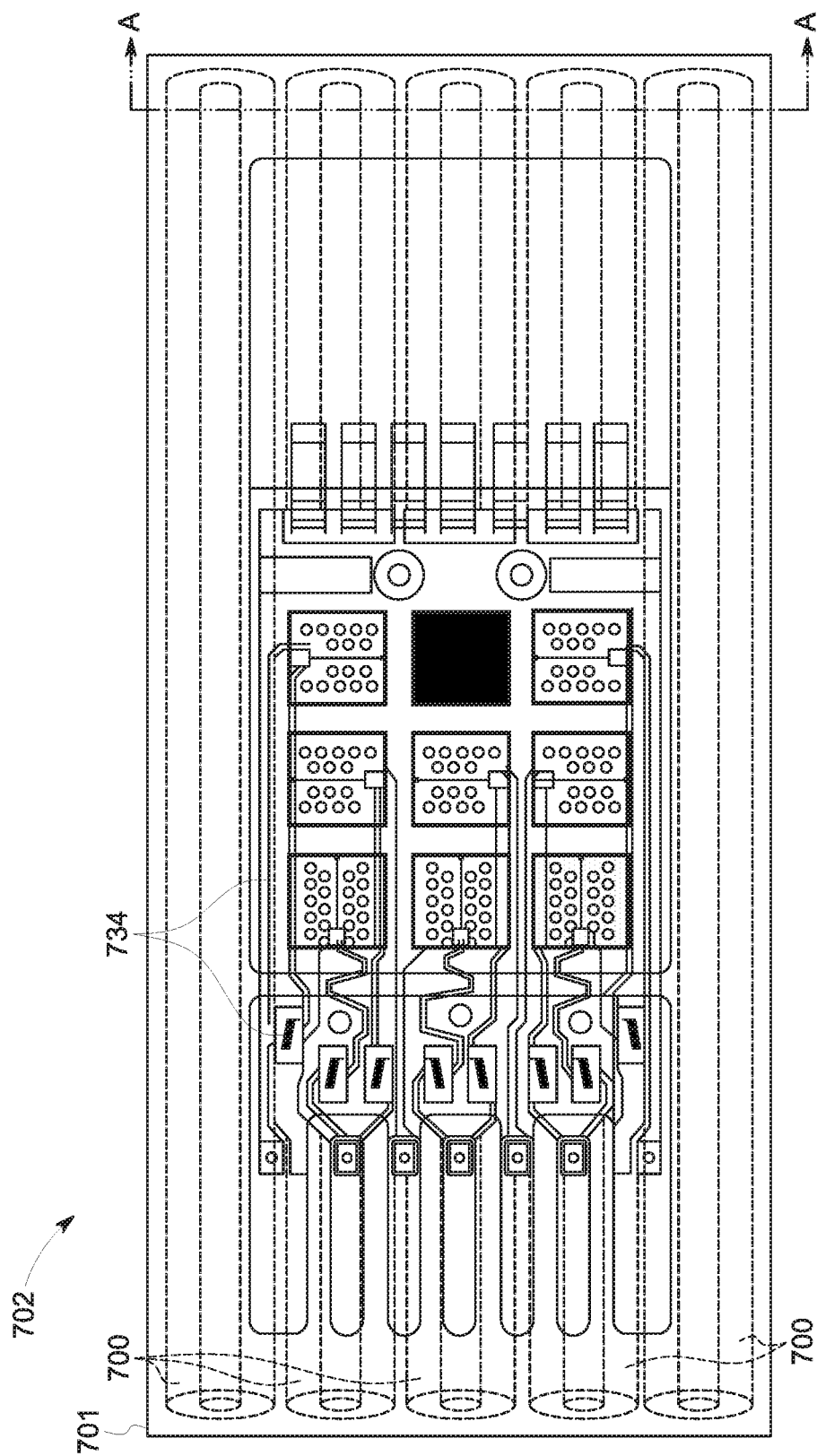
FIG. 7 illustrates a top view of one example of an integrated packaging or cold plate assembly.

FIG. 7 illustrates a top view of one example of an integrated packaging or cold plate assembly 702. The cold plate assembly 702 includes a cold plate outer housing 701 that includes several cooler devices 700 in a lateral or side-by-side arrangement along with electronic devices 734. The cooler devices 700 can represent one or more of the cooler devices described herein. The thermal capacity capability increases provided by the cooler devices may fail to cool the heat sources if the cooler devices are not effectively integrated near a device junction with the heat sources. Therefore, an integrated thermal capacity approach as described herein may be needed. The integrated packages described herein can provide high efficiency power electronics modules that dissipate less heat and that provide a high-power density cooling solution that efficiently manages the heat that is generated.

The cold plate assembly 702 includes or is coupled with electronic devices 734, such as circuits, processors, controllers, or the like, that generate heat. These electronic devices 734 generate heat and can represent the heat source 116 described above. In the illustrated example, several of the cooler devices 700 are disposed laterally next to each other such that each cooler device 700 is located beneath a different portion of the electronic devices 734. Alternatively, the cooler devices 700 may be disposed in a vertical arrangement with several of the cooler devices 700 located below the same portion of the electronic devices 734. For example, two or more of the cooler devices 700 can be vertically disposed relative to each other beneath the same part of the electronic devices 734.

Figure 8:
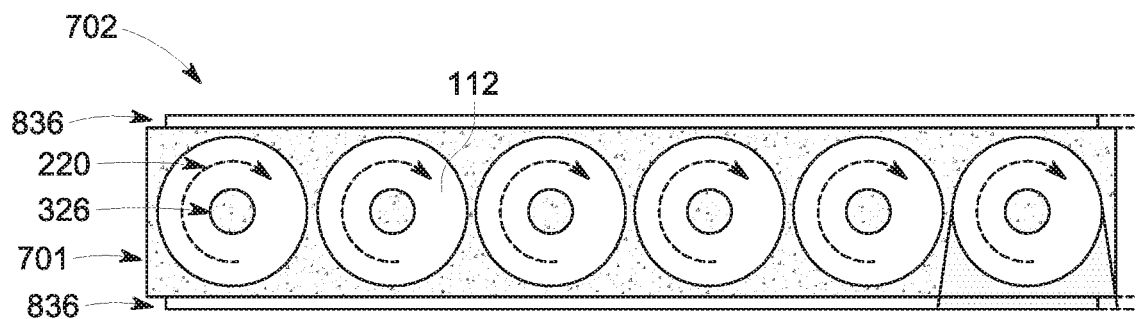
FIG. 8 illustrates a cross-sectional view of one embodiment of the cold plate assembly along line A-A in FIG. 7.

FIG. 8 illustrates a cross-sectional view of one embodiment of the cold plate assembly 702 along line A-A in FIG. 7. The cold plate assembly 702 can be a dielectric body or formed from dielectric materials such that the cold plate assembly 702 does not conduct electric current. For example, the cold plate assembly 702 can be additively manufactured or manufactured in another manner from materials such as dielectric aluminum oxide (Al2O3), aluminum nitride (AlN), or the like. Conductive interface layers or coatings 836 can be provided on one or more external surfaces of the cold plate assembly 702 to improve thermal conductivity and/or coupling between the cooler devices 700 and the electronic devices 734. The conductive interface layers 836 can be formed by metallizing one or more surfaces of the cold plate assembly 702 with a thermally conductive material, such as copper or a copper alloy.

Figure 9:
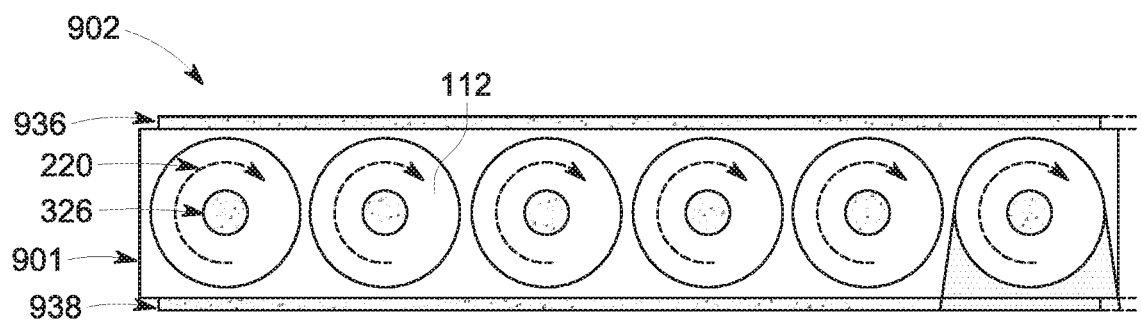
FIG. 9 illustrates a cross-sectional view of another embodiment of a cold plate assembly along line A-A in FIG. 7.

FIG. 9 illustrates a cross-sectional view of another embodiment of a cold plate assembly 902. The cold plate assembly 902 can represent the cold plate assembly 702 shown in FIG. 7 with the cross-sectional view along line A-A in FIG. 7. In contrast to the cold plate assembly 702, an outer housing 901 of the cold plate assembly 902 shown in FIG. 9 can be a thermally conductive body or formed from conductive materials such that the cold plate assembly 902 is electrically and thermally conductive. For example, the cold plate assembly 902 can be additively manufactured or manufactured in another manner from materials such as aluminum, copper, or the like. Dielectric or non-conductive interface layers or coatings 938 can be provided on one or more external surfaces of the cold plate assembly 902 to avoid conductively coupling the electronic devices 734 with the cold plate assembly 902 (which could result in an electrical short). The non-conductive interface layers 938 can be ceramic or ceramic composite layers. Optionally, the cold plate assembly 702, 802, 902 can be formed from a semiconductor or wide band gap semiconductor material.

FIGS. 10 through 13 illustrate additional embodiments of integrated electronic modules 1040, 1140, 1240, 1340. The integrated electronic modules 1040, 1140, 1240, 1340 include electronic devices 734 that are thermally coupled with one or more cooler devices described herein. The electronic module 1040 shown in FIG. 10 includes a cold plate assembly 1002 in which one or more cooler devices are disposed. These cooler devices can be oriented in a lateral, side-by-side arrangement and/or in a vertical, side-by-side arrangement. The cold plate assembly 1002 is coupled with a thermal coupling assembly 1042 that thermally couples the cold plate assembly 1002 (and the cooler devices disposed therein) with the electronic devices 734.

In the illustrated example, the thermal coupling assembly 1042 includes electrically and thermally conductive plates or bodies 1044 on opposite sides of an electrically nonconductive (but thermally conductive) plate or body 1046. The electrically and thermally conductive plates or bodies 1044 can be copper plates or metallized layers. The electrically nonconductive and thermally conductive plate or body 1046 can be formed from aluminum nitride (AlN), aluminum oxide (Al2O3), silicon nitride (Si3N4), or the like.

The thermal coupling assembly 1042 conducts heat from the electronic devices 734 to the cold plate assembly 1002 that includes the cooler device(s). The thermal coupling assembly 1042 can be secured with the cold plate assembly 1002 by a solder layer 1048 in one example. The electronic devices 734 can be coupled with a power overlay module 1050 such that the electronic devices 734 are between the power overlay module 1050 and the thermal coupling assembly 1042.

The electronic devices 734 can be high power electronic devices that generate heat. As one example, the electronic devices 734 can include switches and other devices, such as silicon carbide (SiC) metal-oxide-semiconductor field effect transistor (MOSFET), SiC diode, or the like. The electronic devices 734 can create significant heat during pulsed or transitory conduction of large currents through the electronic devices 734, which is at least partially dissipated and cooled by the cooler devices on one side of the electronic devices 734. Other power modules may include the electronic devices 734 coupled with a heat sink and base plate. The cold plate assembly 1002 and cooler devices in the cold plate assembly 1002 can replace this heat sink and base plate to cool the electronic devices 734. As shown, the cooler devices in the cold plate assembly 1002 are located on one side only of the heat sources (e.g., the electronic devices 734).

The cold plate assembly 1002 in which the cooler devices are disposed may be formed from an electrically and thermally conductive material, such as one or more metal or metal alloys. The solder 1048 may be electrically conductive, as are the bodies or plates 1044. The body or plate 1046 in the thermal coupling assembly may be provided to prevent an electric short or conductive pathway existing between the electronic devices 734 and the cold plate assembly 1002.

Figure 10:
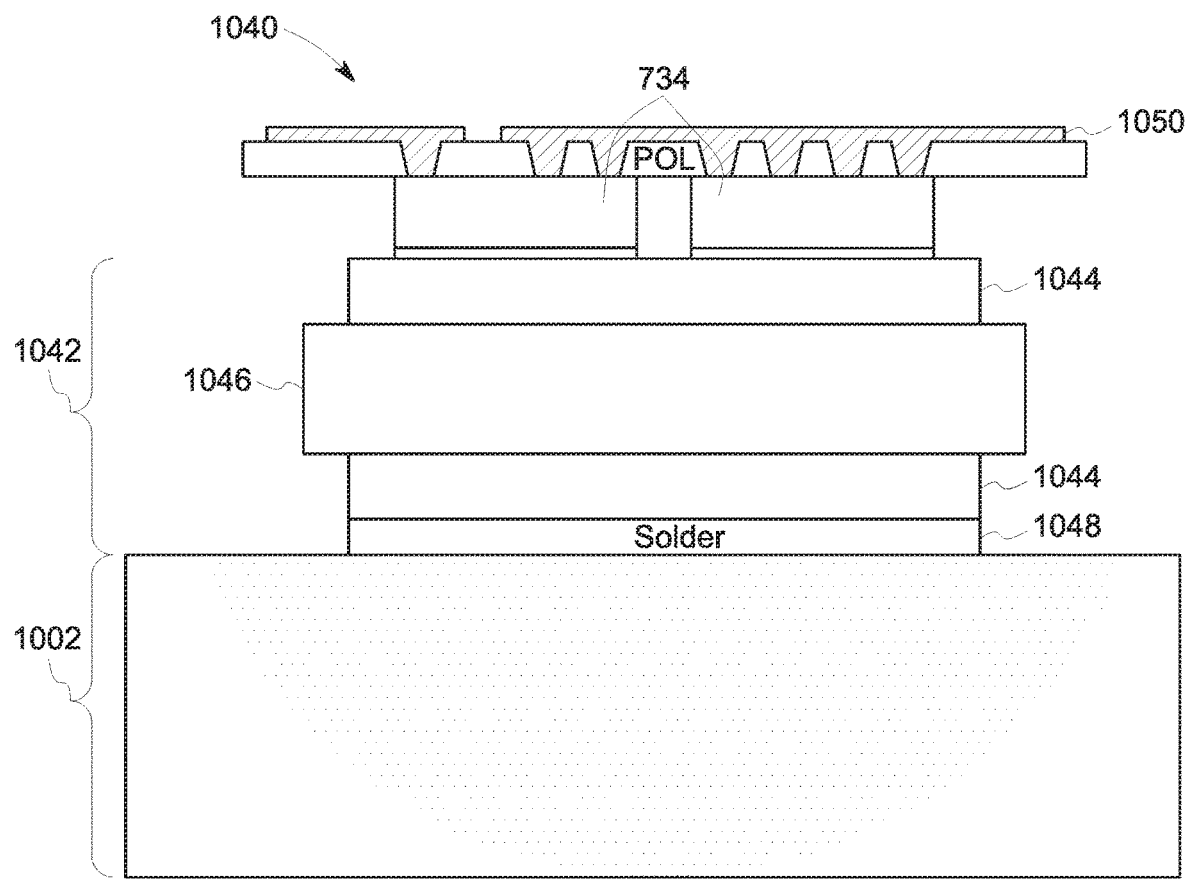
FIG. 10 illustrates an additional embodiment of an integrated electronic module.
Figure 11:
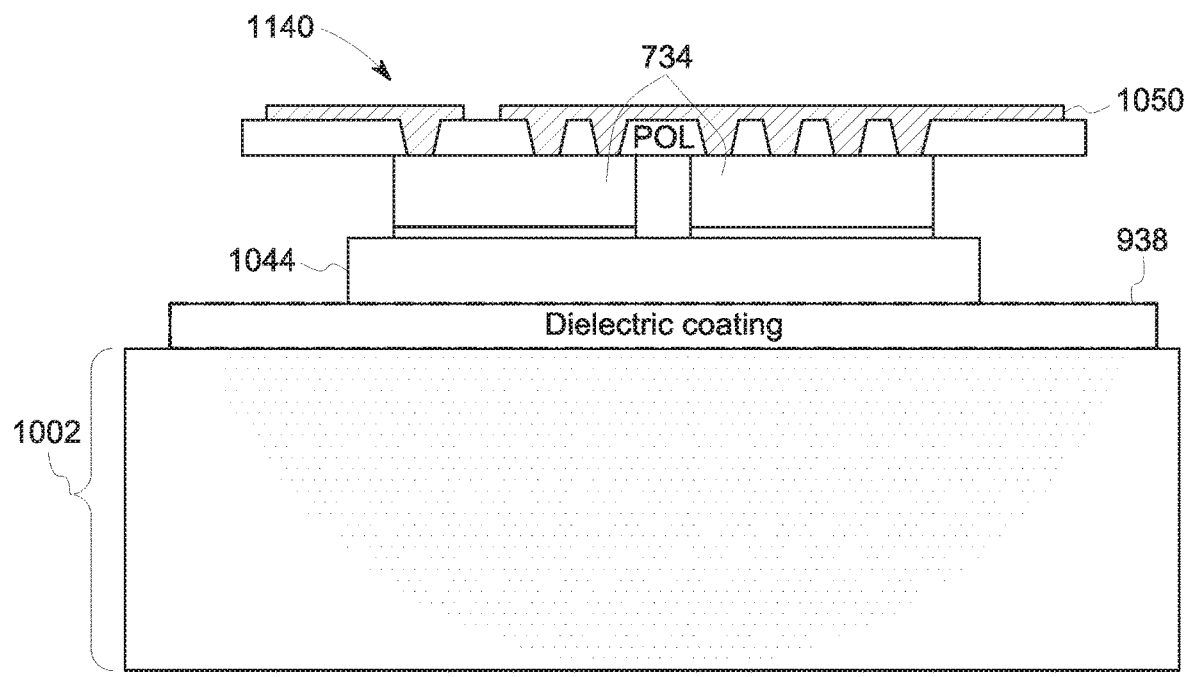
FIG. 11 illustrates an additional embodiment of an integrated electronic module.

The electronic module 1140 shown in FIG. 11 is similar to the module 1040 shown in FIG. 10 in that the module 1140 includes the electronic devices 734, the power overlay module 1050, and the cold plate assembly 1002 with the one or more cooler devices. The cold plate assembly 1002 is thermally coupled with the electronic devices 734 by one of the electrically and thermally conductive bodies or plates 1044. In one embodiment, the nonconductive interface layer 938 is provided between the conductive body or plate 1044 and the cold plate assembly 1002 to prevent the body or plate 1044 from creating an electrical short or conductive pathway between the electronic devices 734 and the cold plate assembly 1002. Alternatively, the cold plate assembly 1002 can be formed from a dielectric or electrically nonconductive material (but thermally conductive material), as described above. This can avoid the need for the interface layer 938. That is, the electrically nonconductive cold plate assembly 1002 can be directly coupled with the body or plate 1044 (e.g., by solder 1048).

The electronic module 1140 shown in FIG. 11 is similar to the module 1040 shown in FIG. 10 in that the module 1140 includes the electronic devices 734, the power overlay module 1050, and the cold plate assembly 1002 with the one or more cooler devices. The cold plate assembly 1002 is thermally coupled with the electronic devices 734 by one of the electrically and thermally conductive bodies or plates 1044. In one embodiment, the nonconductive interface layer 938 is provided between the conductive body or plate 1044 and the cold plate assembly 1002 to prevent the body or plate 1044 from creating an electrical short or conductive pathway between the electronic devices 734 and the cold plate assembly 1002. Alternatively, the cold plate assembly 1002 can be formed from a dielectric or electrically nonconductive material (but thermally conductive material), as described above. This can avoid the need for the interface layer 938. That is, the electrically nonconductive cold plate assembly 1002 can be directly coupled with the body or plate 1044 (e.g., by solder 1048).

Figure 12:
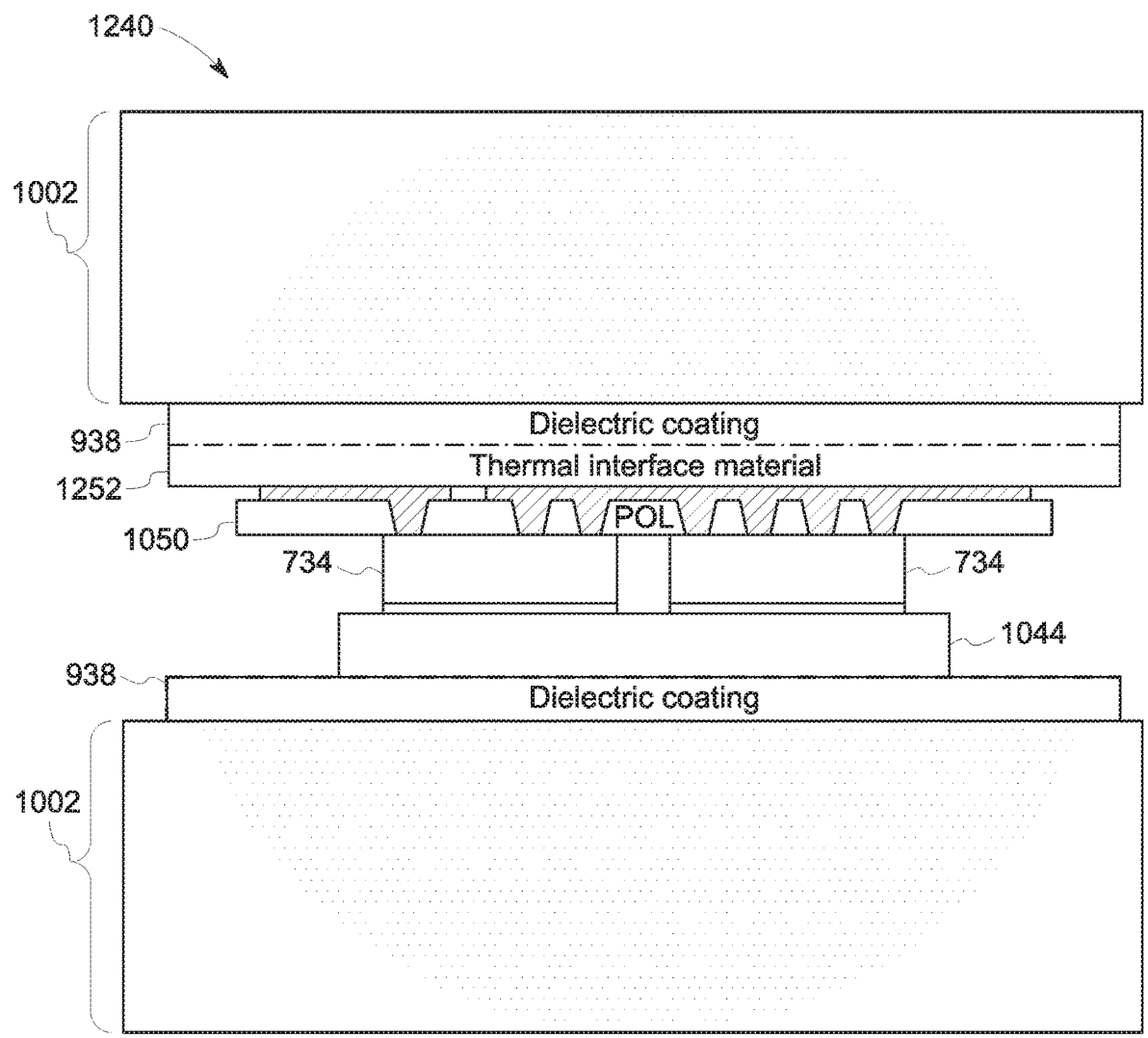
FIG. 12 illustrates an additional embodiment of an integrated electronic module.

The electronic module 1240 shown in FIG. 12 is similar to the module 1140 shown in FIG. 11 in that the module 1240 includes the electronic devices 734, the power overlay module 1050, the cold plate assembly 1002 with the one or more cooler devices, at least one of the electrically and thermally conductive plates or bodies 1044, and the interface layer 938. One difference between the modules 1140, 1240 is the addition of another cold plate assembly 1002 disposed on an opposite side of the electronic devices 734. As shown, the electronic devices 734 are provided with cold plate assemblies 1002 having cooler devices described herein on opposite sides of the electronic devices 734. This can enable the module 1240 to dissipate more heat and/or operate at higher powers due to the ability of the additional cooler devices to further cool the electronic devices 734.

In the illustrated embodiment, both of the cold plate assemblies 1002 are formed from electrically and thermally conductive materials. The nonconductive but thermally conductive interface layers 938 can be provided between one of the cold plate assemblies 1002 and the body or plate 1044 and between the other cold plate assembly 1002 and the power overlay module 1050. These interface layers 938 can prevent an electric short or conductive pathway from being formed between either cold plate assembly 1002 and the electronic devices 734 and/or power overlay module 1050. Optionally, a thermal interface material layer 1252 can be provided between one of the interface layers 938 and the power overlay module 1050. The thermal interface material layer 1252 can be a thermally conductive, but electrically nonconductive layer, such as aluminum nitride (AlN) or aluminum oxide (Al2O3). This thermal interface material layer 1252 can further electrically insulate the power overlay module 1050 from the upper cold plate assembly 1002 while allowing heat from the electric devices 734 to be conducted to the cooler devices in the upper cold plate assembly 1002.

Alternatively, one or both of the cold plate assemblies 1002 can be formed from electrically nonconductive, but thermally conductive materials. In such an embodiment, these cold plate assemblies 1002 can be directly coupled with the power overlay module 1050 and/or the conductive body or plate 1044.

Figure 13:
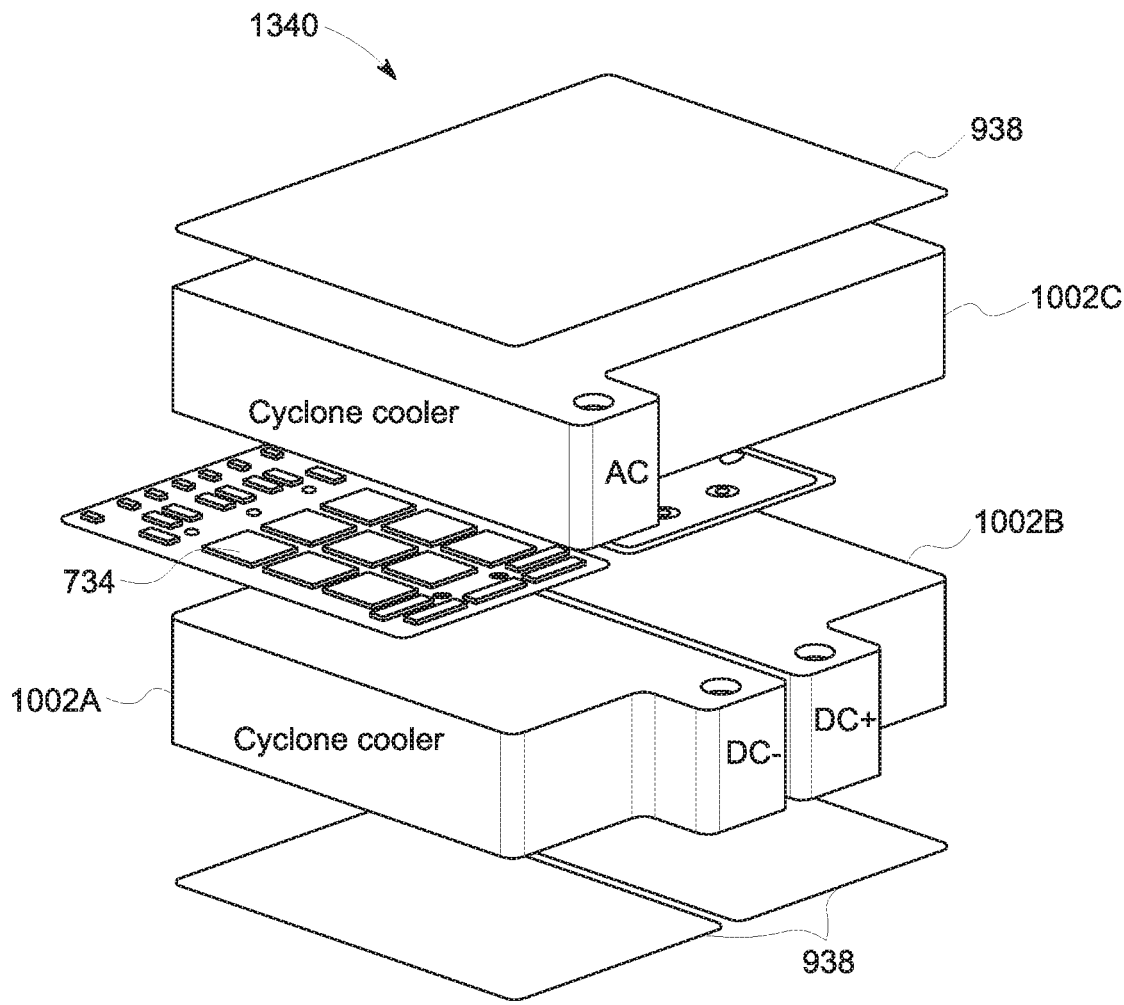
FIG. 13 illustrates an additional embodiment of an integrated electronic module.

The electronic module 1340 shown in an exploded view in FIG. 13 includes electronic devices 734 with cold plate assemblies 1002 (e.g., assemblies 1002A-C) having cooler devices disposed on opposite sides of the electronic devices 734. Alternatively, the electronic devices 734 may include the cold plate assembly 1002 with the cooler devices on only one side of the electronic devices 734. One difference between the electronic module 1340 and the electronic modules 1040, 1140, 1240 is that the cold plate assemblies 1002 can be used as electrical interconnects to the electronic devices 734. For example, contacts of the electronic devices 734 (e.g., sources, drains, gates, etc.) can be conductively coupled with the conductive cold plate assemblies 1002 that also include the cooler devices. Electric current can be conducted through the conductive cold plate assemblies 1002 to the electronic devices 734 and/or from the electronic devices 734. For example, different polarities of direct current can be conducted to the electronic devices 734 (e.g., one or more inverters) via the cold plate assemblies 1002A, 1002B and alternating current can be output from the electronic devices 734 to one or more loads via the cold plate assembly 1002C. The cold plate assemblies 1002 can perform multiple functions: conduction of current to and/or from the electronic devices 734 and cooling of the electronic devices 734. Optionally, one or more interface layers 938 can be provided on the cold plate assemblies 1002 to prevent conduction between the cold plate assemblies 1002 and one or more other conductive components.

Figure 14:
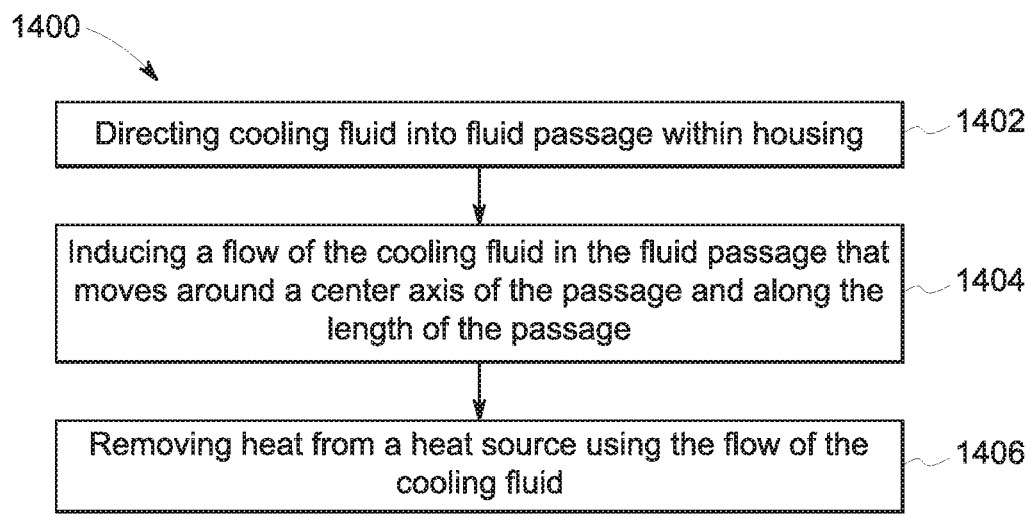
FIG. 14 illustrates a flowchart of one embodiment of a method for cooling one or more heat sources.

FIG. 14 illustrates a flowchart of one embodiment of a method 1400 for cooling one or more heat sources. The method 1400 can represent the functionality of one or more of the cooler devices described herein. At 1402, one or more cooling fluids are directed into a passage located within a housing. A phase-changing cooling fluid can be directed into the fluid passage of the channel defined by the cooler device through the inlet end of the channel along the center axis of the channel and/or through the inlet opening of the channel that directs the cooling fluid tangentially into the fluid passage. Optionally, the same or different cooling fluid or phase-changing material can be directed into the containment or condenser located within the fluid passage.

At 1404, flow of at least one of the cooling fluids is induced into a swirling flow within the fluid passage. As described above, this swirling flow can involve the cooling fluid both flowing circumferentially around the center axis of the passage and longitudinally along the length of the center axis from the inlet end of the passage toward the opposite outlet end. The swirling flow can be induced by helical ridges extending inward from the interior surface of the channel that defines the passage, by directing the cooling fluid into the passage along a tangential direction, and/or by directing the cooling fluid out of the passage along a tangential direction.

At 1406, heat is removed from the heat source using the swirling flow of the cooling fluid in the passage. As described above, heat from the heat source causes part of the cooling fluid to change phases from a liquid phase to a supercritical and/or vapor phase as that part of the cooling fluid flows closer to the heat source (relative to another part of the cooling fluid that remains in the liquid phase). The difference in densities between the supercritical and/or vapor phase of the cooling fluid and the liquid phase of the cooling fluid as the swirling flow moves the cooling fluid can cause the supercritical and/or vapor phase of the cooling fluid to rotate inward toward the center axis of the passage. This supercritical and/or vapor phase of the cooling fluid condenses closer to the center axis and returns to the liquid phase. The cooling fluid or phase changing material in the center containment or condenser can assist in condensing the supercritical and/or vapor phase of the cooling fluid to the liquid phase. The liquid phase of the cooling fluid rotating around the center axis of the passage within the cooler device can then return to a location closer to the heat source, where the phase of the cooling fluid can again change.

In one embodiment, a cyclone cooler device includes a housing that defines one or more interior channels forming one or more fluid passages. Each of the one or more fluid passages is elongated along a center axis from an inlet end of the fluid passage to an opposite, outlet end of the fluid passage. The inlet end of each of the one or more fluid passages is configured to be fluidly coupled with one or more replenishing sources of one or more cooling fluids. Each of the one or more fluid passages also is configured to be thermally coupled with one or more heat sources. One or more of the fluid passages or configurations of the inlet ends of the fluid passages are shaped to induce a swirling flow of the one or more cooling fluids within the one or more fluid passages while the one or more fluid passages are thermally coupled with the one or more heat sources. The swirling flow of the one or more cooling fluids removes thermal energy from and cools the one or more heat sources.

Optionally, the swirling flow of the one or more cooling fluids that is induced by the one or more fluid passages involves a cooler liquid state of the swirling flow of the one or more cooling fluids to rotate radially outward toward the one or more heat sources and a warmer liquid state of the swirling flow including vapor or supercritical state of the one or more cooling fluids to rotate radially inward toward the center axis of the one or more fluid passages due to a difference in density between the cooler liquid state and the warmer liquid state of the swirling flow of the one or more cooling fluids.

Optionally, the swirling flow of the one or more cooling fluids that is induced by the one or more fluid passages involves a vaporized portion of the one or more cooling fluids rotating around and radially inward toward the center axis of the one or more fluid passages and away from the one or more heat sources for condensing into a condensed portion of the one or more cooling fluids. The swirling flow of the one or more cooling fluids also can involve the condensed portion of the one or more cooling fluids rotating around and radially outward away from the center axis of the one or more fluid passages and toward the one or more heat sources.

Optionally, for each of the one or more fluid passages, the housing has an interior surface facing the center axis of the fluid passage that induces the swirling flow of the one or more cooling fluids around the center axis within the fluid passage and relative to the one or more heat sources without the housing moving relative to the within the fluid passage heat sources.

Optionally, the inlet end of the one or more fluid passages is configured to induce the swirling flow of the one or more cooling fluids.

Optionally, the outlet end of the one or more fluid passages is configured to induce the swirling flow of the one or more cooling fluids.

Optionally, the interior surface of the housing includes helical ridges that protrude radially inward from the interior surface toward the center axis of the one or more fluid passages.

Optionally, the helical ridges protrude partially from the interior surface toward the center axis of the one or more fluid passages but do not extend to the center axis of the one or more fluid passages.

Optionally, the swirling flow of the one or more cooling fluids that is induced by the one or more fluid passages includes a phase change material in a containment around the center axis of the one or more fluid passages to absorb the thermal energy.

Optionally, the swirling flow of the one or more cooling fluids that is induced by the one or more fluid passages includes another flow in a containment flowing along the center axis of the one or more fluid passages from the inlet end toward the outlet end of the one or more fluid passages.

In one embodiment, a cold plate assembly includes a cold plate outer housing configured to be in thermal contact with a heat source and a housing having two or more fluid passages that are each elongated along a center axis and that each define an interior channel along the center axis from a first end of the fluid passage to an opposite, second end of the fluid passage. The fluid passage is shaped to induce a swirling flow of a cooling fluid within the fluid passage while the fluid passage is thermally coupled with the heat source. The swirling flow of the fluid passage removes thermal energy from and cools the heat source.

Optionally, the two or more fluid passages are disposed laterally side-by-side relative to the heat source.

Optionally, the two or more fluid passages are disposed vertically side-by-side relative to the heat source.

Optionally, the housing is formed from a conductive material and is configured to be coupled with the heat source via a dielectric coating.

Optionally, the housing is formed from a dielectric material and is configured to be coupled with the heat source via a conductive coating.

Optionally, the housing is formed from a semiconductor or wide band gap semiconductor material and is configured to be thermally coupled with the heat source.

Optionally, the outer housing is configured to be disposed on one side of the heat source.

Optionally, the outer housing is a first housing, and the assembly also includes a second housing configured to be in thermal contact with the heat source and including two or more of the fluid passages disposed within the second housing. The first and second outer housings can be configured to be disposed on opposite sides of the heat source.

Optionally, the housing is formed from a conductive material that is configured to conduct electric current as an electrical interconnect with the heat source.

In one embodiment, a method for cooling a heat source is provided. The method includes directing a flow of a cooling fluid into a fluid passage within a housing. The fluid passage is elongated along a center axis. The method also includes removing thermal energy from the heat source by inducing a swirling movement of the cooling fluid in the fluid passage around the center axis and along the center axis. The swirling movement of the cooling fluid involves a vaporized portion of the cooling fluid rotating around and radially inward toward the center axis and away from the heat source for condensing into a condensed portion of the cooling fluid. The swirling movement of the cooling fluid also involves the condensed portion of the cooling fluid rotating around and radially outward away from the center axis and toward the heat source.

Optionally, the method also includes directing a flow of one or more of a phase change material or a subcooled liquid disposed within an internal bore tube of a condenser located within the fluid passage.

Optionally, the swirling movement of the cooling fluid rotates around the condenser.

Optionally, the swirling movement of the cooling fluid moves the vaporized portion of the cooling fluid radially inward toward the condenser for condensing into the condensed portion of the cooling fluid.

Optionally, directing the flow of the cooling fluid includes directing the cooling fluid into the fluid passage in a tangential direction relative to an interior surface of the housing that defines the fluid passage.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. While the dimensions and types of materials described herein are intended to define the parameters of the invention, they are by no means limiting and are exemplary embodiments. Many other embodiments will be apparent to those of skill in the art upon reviewing the above description. The terms "including" and "in which" are used as the plain-English equivalents of the respective terms "comprising" and "wherein." Moreover, the terms "first," "second," "third," "upper," "lower," "bottom," "top," etc. are used merely as labels, and are not intended to impose numerical or positional requirements on their objects.

This written description uses examples to disclose several embodiments of the invention, including the best mode, and also to enable one of ordinary skill in the art to practice the embodiments of invention, including making and using any devices or systems and performing any incorporated methods.

As used herein, an element or step recited in the singular and proceeded with the word "a" or "an" should be understood as not excluding plural of the elements or steps, unless such exclusion is explicitly stated. Furthermore, references to "one embodiment" of the present invention are not intended to be interpreted as excluding the existence of additional embodiments that also incorporate the recited features. Moreover, unless explicitly stated to the contrary, embodiments "comprising," "including," or "having" an element or a plurality of elements having a particular property may include additional such elements not having that property.

What is claimed is:

1. A cyclone cooler device comprising:
   a unitary housing that defines a plurality of interior channels forming a plurality of fluid passages; and
   a plurality of containments, each containment disposed within a different one of the plurality of interior channels, each containment configured to contain a containment fluid,
   wherein an entire perimeter of each of the plurality of fluid passages is defined within the unitary housing,
   wherein each of the plurality of fluid passages is elongated along a center axis from an inlet end to an opposite, outlet end,
   wherein the inlet end of each of the plurality of fluid passages is configured to be fluidly coupled with one or more replenishing sources of one or more cooling fluids,
   wherein each of the plurality of fluid passages is also configured to be thermally coupled with one or more heat sources,
   wherein the plurality of fluid passages or configurations of the inlet end of each of the plurality of fluid passages are shaped to induce a swirling flow of the one or more cooling fluids within the plurality of fluid passages while the plurality of fluid passages are thermally coupled with the one or more heat sources,
   wherein, for each of the plurality of fluid passages, the unitary housing has an interior surface facing the center axis,
   wherein, for each of the plurality of fluid passages, the interior surface of the unitary housing includes a helical ridge that protrudes radially inward toward the center axis and toward the containment, wherein the helical ridge does not contact the containment,
   wherein each helical ridge is configured to induce swirl in the one or more cooling fluids around the center axis within each of the plurality of fluid passages and relative to the one or more heat sources without the unitary housing moving relative to the plurality of fluid passages, and
   wherein, for each of the plurality of fluid passages, no structure extends from the interior surface to the center axis.

2. The cyclone cooler device of claim 1, wherein the swirling flow of the one or more cooling fluids that is induced by each of the plurality of fluid passages involves a cooler liquid state of the swirling flow of the one or more cooling fluids to rotate radially outward toward the one or more heat sources and a warmer liquid state of the swirling flow including vapor or supercritical state of the one or more cooling fluids to rotate radially inward toward the center axis due to a difference in density between the cooler liquid state and the warmer liquid state of the swirling flow of the one or more cooling fluids.

3. The cyclone cooler device of claim 1, wherein the swirling flow of the one or more cooling fluids that is induced by each of the plurality of fluid passages involves a vaporized portion of the one or more cooling fluids rotating around and radially inward toward the center axis and away from the one or more heat sources for condensing into a condensed portion of the one or more cooling fluids, the swirling flow of the one or more cooling fluids also involving the condensed portion of the one or more cooling fluids rotating around and radially outward away from the center axis and toward the one or more heat sources.

4. The cyclone cooler device of claim 1, wherein the inlet end of each of the plurality of fluid passages is configured to induce the swirling flow of the one or more cooling fluids.

5. The cyclone cooler device of claim 1, wherein the outlet end of each of the plurality of fluid passages is configured to induce the swirling flow of the one or more cooling fluids.

6. The cyclone cooler device of claim 1, wherein the helical ridge protrudes partially from the interior surface toward the center axis but does not extend to the center axis.

7. The cyclone cooler device of claim 1,
wherein each containment is a sealed cylindrical chamber that extends along the center axis, wherein the containment fluid is a phase change material.

8. The cyclone cooler device of claim 1,
wherein the containment is a cylindrical chamber extending along the center axis, wherein the containment is a conduit that contains the containment fluid, wherein the conduit is configured to allow the containment fluid to flow.

9. A cold plate assembly comprising:
a unitary cold plate outer housing configured to be in thermal contact with a heat source; and
a plurality of containments,
wherein the unitary cold plate outer housing defines a plurality of interior channels forming a plurality of fluid passages that are each elongated along a center axis and that extend along the center axis from a first end to an opposite, second end,
wherein each containment is disposed within a different one of the plurality of interior channels, each containment configured to contain a containment fluid,
wherein an entire perimeter of each of the plurality of fluid passages is defined within the unitary cold plate outer housing,
wherein each of the plurality of fluid passages is shaped to induce a swirling flow of a cooling fluid therewithin while thermally coupled with the heat source,
wherein the swirling flow of each of the plurality of fluid passages removes thermal energy from and cools the heat source,
wherein, for each of the plurality of fluid passages, the unitary cold plate outer housing has an interior surface facing the center axis,
wherein, for each of the plurality of fluid passages, the interior surface of the unitary cold plate outer housing includes a helical ridge that protrudes radially inward toward the center axis and toward the containment, wherein the helical ridge does not contact the containment,
wherein each helical ridge is configured to induce the swirling flow of the cooling fluid, and
wherein, for each of the plurality of fluid passages, no structure extends from the interior surface to the center axis.

10. The cold plate assembly of claim 9, wherein the plurality of fluid passages are disposed laterally side-by-side relative to the heat source.

11. The cold plate assembly of claim 9, wherein the plurality of fluid passages are disposed vertically side-by-side relative to the heat source.

12. The cold plate assembly of claim 9, wherein the unitary cold plate outer housing is formed from a conductive material and is configured to be coupled with the heat source via a dielectric coating.

13. The cold plate assembly of claim 9, wherein the unitary cold plate outer housing is formed from a dielectric material and is configured to be coupled with the heat source via a conductive coating.

14. The cold plate assembly of claim 9, wherein the unitary cold plate outer housing is formed from a semiconductor or wide band gap semiconductor material and is configured to be thermally coupled with the heat source.

15. The cold plate assembly of claim 9, wherein the unitary cold plate outer housing is configured to be disposed on one side of the heat source.

16. The cold plate assembly of claim 9, wherein the unitary cold plate outer housing is a first unitary cold plate outer housing,
wherein the cold plate assembly further comprises:
a second unitary cold plate outer housing configured to be in thermal contact with the heat source and including a plurality of fluid passages disposed within the second unitary cold plate outer housing,
wherein the first unitary cold plate outer housing and the second unitary cold plate outer housing are configured to be disposed on opposite sides of the heat source.

17. The cold plate assembly of claim 9, wherein the unitary cold plate outer housing is formed from a conductive material that is configured to conduct electric current as an electrical interconnect with the heat source.

18. A method for cooling a heat source, the method comprising:
directing a flow of a cooling fluid into a plurality of fluid passages within a unitary housing,
wherein each of the plurality of fluid passages is elongated along a center axis,
wherein the unitary housing has an interior surface facing the center axis,
wherein an entire perimeter of each of the plurality of fluid passages is defined within the unitary housing,
wherein the unitary housing comprises a plurality of containments, each containment disposed within a different one of the plurality of fluid passages, each containment configured to contain a containment fluid,
wherein the interior surface of the unitary housing includes a helical ridge that protrudes radially inward toward the center axis and toward the containment, wherein the helical ridge does not contact the containment; and
inducing, with the helical ridge, a swirling movement in the cooling fluid in each of the plurality of fluid passages around the center axis and along the center axis;
transferring thermal energy from the heat source to the cooling fluid;
changing a phase of a portion of the cooling fluid into a vapor phase,
wherein the portion of the cooling fluid that is changed into the vapor phase comprises a vaporized portion;
separating the cooling fluid into the vaporized portion and a liquid portion in response to a buoyancy force;
rotating the vaporized portion of the cooling fluid around and radially inward toward the center axis and away from the heat source; and
rotating the liquid portion of the cooling fluid around and radially outward away from the center axis and toward the heat source,
wherein, for each of the plurality of fluid passages, no structure extends from the interior surface to the center axis.

19. The method of claim 18, further comprising:
directing a flow of one or more of a phase change material or a subcooled liquid disposed within an internal bore tube of a condenser located within each of the plurality of fluid passages.

20. The method of claim 19, wherein the swirling movement of the cooling fluid rotates around the condenser.

21. The method of claim 19, wherein the swirling movement of the cooling fluid moves the vaporized portion of the cooling fluid radially inward toward the condenser for condensing into the liquid portion of the cooling fluid.

22. The method of claim 18, wherein directing the flow of the cooling fluid includes directing the cooling fluid into each of the plurality of fluid passages in a tangential direction relative to the interior surface of the unitary housing that defines each of the plurality of fluid passages.

\* \* \* \* \*